United States Patent [19]

Flowers

[11] 4,010,143

[45] Mar. 1, 1977

[54] MOLDING COMPOUND CONTAINING N-METHYL-Z PYRROLIDONE AND METHOD

[75] Inventor: Dervin L. Flowers, Scottsdale, Ariz.

[73] Assignee: Motorola, Inc., Chicago, Ill.

[22] Filed: Dec. 26, 1973

[21] Appl. No.: 428,472

[52] U.S. Cl. .......................... 260/59 EP; 290/588; 174/52 PE; 260/2 EP; 260/2 S; 260/30.2; 260/47 R; 264/272

[51] Int. Cl.² ........................................ C08G 30/06

[58] Field of Search ............ 260/47 EN, 47 R, 2 N, 260/2 S, 59, 46.5, 30.2; 252/182; 264/272

[56] References Cited

UNITED STATES PATENTS

| | | | |
|---|---|---|---|
| 3,423,516 | 1/1969 | Segerson | 264/272 X |
| 3,733,305 | 5/1973 | Loewrigkeit et al. | 260/30.2 |
| 3,764,384 | 10/1973 | Berni | 134/38 X |

*Primary Examiner*—Theodore E. Pertilla
*Attorney, Agent, or Firm*—Henry T. Olsen

[57] ABSTRACT

A molding compound consisting essentially of 0.1 to 10 percent of N-methyl-2-pyrrolidone and a resin selected from the group consisting of epoxy, phenolic and silicone resins. The compound is injected in the mold as in the standard molding process and reacts with any surface contamination that may remain from the previous injection. The contamination is thereby removed with the removal of the molded device and the process is essentially self-cleaning.

2 Claims, No Drawings

MOLDING COMPOUND CONTAINING N-METHYL-Z PYRROLIDONE AND METHOD

RELATED APPLICATIONS

This application is related to application Ser. No. 394,228 filed Sept. 4, 1973 and to application Ser. No. 427,601 filed Dec. 26, 1973.

BACKGROUND OF THE INVENTION

This invention relates to plastic molding processes and more particularly to the molding of plastic encapsulated semiconductor devices.

In a conventional method of manufacturing semiconductor devices, and particularly, integrated circuits, the semiconductor chip or die is mounted on a lead frame. The lead frame has a support pad for the die and a plurality of fingers that provide the electrical terminals for the device. Following suitable bonding between portions of the semiconductor device and the fingers of the lead frame, the lead frame and the semiconductor chip is placed in a molding die which is closed therearound and molding compound injected therein to form the molded plastic package. The tie-bar portions of the lead frame are then removed to form separated electrical terminals for the finished device.

Whatever polymer utilized in the foregoing process, epoxy, phenolic or silicone, the process, like all transfer molding operations, results in highly cross-linked material that sticks to the mold surfaces, resulting in considerable down time for cleaning and renewing the mold surfaces. Cleaning is generally accomplished either by vigorous mechanical brushing or molding with a compound more reactive and stronger than the molding compound already adhered to the surfaces. In the latter case of molding with the cleaning compound, reaction of that compound with the contaminating surface occurs to an extent that when the molded cleaning compound is removed from the mold, the contaminating material, reacted with and sticking to the cleaning compound, is also removed. In that particular case, melamine is the reactive cleaning compound having the generic structure

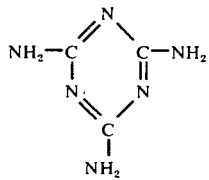

where hydrogen may be partly replaced by alkyl groups of any size or shape. As is disclosed in the co-pending application, above-referenced, such a cleaning compound is substantially improved by the addition of N-methyl-2-pyrrolidone.

SUMMARY OF THE INVENTION

It is an object of this invention to provide an improved molding compound and process for molding semiconductor devices.

It is a further object of this invention to provide a selcleaning molding compound and process for semiconductor plastic encapsulated devices.

In accordance with these objects, there is provided a cleaning compound consisting essentially of one to ten weight percent N-methyl-2-pyrrolidone and a resin selected from the group consisting of epoxy, phenolic and silicone resins. The process comprises the step of substituting the foregoing cleaning compound for the phenolic, epoxy, or silicone previously used to encapsulate the semiconductor devices.

Further objects and advantages of the invention will be noted in the complete description thereof of the preferred compound and process in accordance with the invention.

The molding compound is prepared by intimately mixing 0.1 to 10 weight percent N-methyl-2-pyrrolidone with an epoxy, phenolic or silicone resin of the type previously used in semiconductor packaging. This mixture may then be pelletized for use in the standard transfer molding equipment.

N-methyl-2-pyrrolidone is a highly polar aprotic liquid which is widely employed as a chemical reaction medium. A listing of its many suggested uses is found in M-Pyrol (N-methyl-2-pyrrolidone) Handbook, published by GAF Corporation (1972). Its various physical propery data is set forth therein.

In a conventional method of manufacturing plastic encapsulated semiconductor devices, and particularly, integrated circuits, a semiconductor chip or die is mounted on a lead frame. The lead frame has a support pad for the die and a plurality of fingers which provide electrical terminals for the device, following forming of suitable bonding wires between portions of semiconductor devices in the fingers of the lead frame. The lead frame and the semiconductor chip are placed in the mold of a transfer molding press to form the plastic encapsulation there-around. After a mold is operated for some length of time, particularly, for example, utilizing an epoxy molding compound as the encapsulation for the semiconductor device, it becomes sufficiently dirty, that it must be cleaned. In accordance with one particular cleaning process, a melamine material is substituted for the standard molding compound and ten "dummy" injections are molded. These dummy parts do not contain semiconductor devices but do require standard lead frames to close the die. In addition to the expense of the lead frame, there is the reduction in production capacity because of the time required to provide the melamine molding steps. Following the melamine injections, it is required that the mold be re-treated or reconditioned by ten dummy epoxy molded devices because true production is resumed.

EXAMPLE I

An epoxy-novolac compound with 1.5 percent N-methyl-2-pyrrolidone was run in a previously "dirty" mold in preparing some electrically "good" parts for test. After six injections in the 40 cavity mold, cosmetically and electrically good parts were obtained. The mold in addition, was essentially cleaned up. This indicates a self-cleaning molding composition.

These parts were subjected to HTB (Humidity — 85%, Temperature — 85° C, and Bias — 35V) testing along with a companion set using the same dice lot but without N-methyl-2-pyrrolidone in the molding compound, the failure rate for the N-methyl-2-pyrrolidone doped molding compound was ¼ that for standard compound.

EXAMPLE II

A phenolic molding compound containing three percent N-methyl-2-pyrrolidone was molded and compared as above. The failure rate on HTB was only ½ that for the standard devices.

Thus, it will be noted that with the addition of small amounts of N-methyl-2-pyrrolidone in the molding compound, not only was the process self-cleaning but produced more reliable semiconductor packages.

While the invention has been described by way of the preferred embodiment thereof, it will be obvious to one skilled in the art that suitable modifications may be made therein without departing from the spirit and scope of the invention.

What is claimed is:
1. In a process of manufacturing a semiconductor device wherein a semiconductor chip is mounted on a lead frame and a plastic encapsulation is molded therearound, the improvement comprising the step of:
   encapsulating said device in a molding compound consisting essentially of 0.1 to 10 percent N-methyl-2-pyrrolidone and the balance a semiconductor molding resin selected from the group consisting of epoxy, phenolic and silicone resin.
2. A molding compound consisting essentially of 0.1 to 10 percent N-methyl-2-pyrrolidone and the balance a semiconductor molding resin selected from the group consisting of epoxy, phenolic and silicone resin.